United States Patent
Lee et al.

(10) Patent No.: US 6,656,789 B2
(45) Date of Patent: Dec. 2, 2003

(54) CAPACITOR FOR HIGHLY-INTEGRATED SEMICONDUCTOR MEMORY DEVICES AND A METHOD FOR MANUFACTURING THE SAME

(75) Inventors: Kee Jeung Lee, Seoul (KR); Byung Seop Hong, Seoul (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/026,770

(22) Filed: Dec. 27, 2001

(65) Prior Publication Data

US 2002/0160559 A1 Oct. 31, 2002

(30) Foreign Application Priority Data

Apr. 30, 2001 (KR) ................. 10-2001-0023407

(51) Int. Cl.[7] ......................................... H01L 21/8242
(52) U.S. Cl. ................. 438/253; 438/255; 438/396
(58) Field of Search ................. 438/240, 253, 438/254, 255, 396, 397, 398; 257/295, 296, 303, 304, 306, 309, 310

(56) References Cited

U.S. PATENT DOCUMENTS

| 5,989,973 | A | * | 11/1999 | Zahurak et al. | 438/253 |
| 6,255,159 | B1 | * | 7/2001 | Thakur | 438/253 |
| 6,337,291 | B1 | * | 1/2002 | Park et al. | 438/253 |
| 6,338,995 | B1 | * | 1/2002 | Hwang et al. | 438/240 |
| 6,340,622 | B1 | * | 1/2002 | Lee et al. | 438/240 |
| 6,376,328 | B1 | * | 4/2002 | Aiso et al. | 257/296 |

* cited by examiner

*Primary Examiner*—Wael Fahmy
*Assistant Examiner*—Hoai Pham

(57) ABSTRACT

The present invention relates to a capacitor structure suitable for semiconductor devices and a method for manufacturing such capacitors for highly-integrated memory devices using a TaON dielectric layer having a high dielectric constant. The capacitor is produced on a semiconductor substrate by forming an insulating interlayer on the substrate, forming a contact hole through the insulating interlayer, forming a contact plug in the contact hole, forming a lower electrode with MPS that is electrically connected to the contact plug, doping the lower electrode, forming a TaON dielectric layer on the lower electrode, annealing the TaON dielectric layer, and forming an upper electrode layer on the TaON dielectric layer.

32 Claims, 4 Drawing Sheets

CAPACITOR FOR HIGHLY-INTEGRATED SEMICONDUCTOR MEMORY DEVICES AND A METHOD FOR MANUFACTURING THE SAME

BACKGROUND OF THE INVENTION

1. Field of the Invention

The present invention relates to a semiconductor memory and, more particularly, to a capacitor in a semiconductor device and a method of fabricating a capacitor suitable for a highly-integrated memory device using a TaON dielectric layer having a high dielectric constant.

2. Background of the Related Art

As the degree of integration of memory products increases with the development of fine linewidth semiconductor technology, the unit memory cell area has been greatly reduced and the operating voltages have been decreased.

In spite of this reduction in cell area, the charging capacitance necessary for proper memory device operation has remained at least 25 fF/cell so as to prevent the generation of soft errors and avoid the need to reduce the refresh time.

In a conventional DRAM capacitor utilizing a nitride/oxide ("NO")layer structure as a dielectric, the configuration of the lower electrode may be modified to provide a complex three-dimensional structure or increase the height of the lower electrode. These structural modifications serve to increase the effective surface area and thereby provide the necessary charge capacitance.

However, the range of three-dimensional lower electrode configurations is limited by process difficulties. Moreover, increasing the lower electrode height produces a step height difference between the cell areas and the peripheral circuit areas. Eventually, increasing the step height difference will degrade the yield and reliability of the resulting devices, as a result of difficulties in forming conductors due to difficulties in obtaining a sufficient depth of focus during subsequent photolithographic processes.

Therefore, capacitors having conventional NO dielectric structures cannot be manufactured with both sufficient charge capacitance and cell area required for next generation DRAM devices having 256M or more memory cells.

Lately, developments of $Ta_2O_5$ capacitors, which use $Ta_2O_5$ films having dielectric constants ranging 25 to 27, instead of NO films having dielectric constants ranging 4 to 5, have been made to overcome the short comings of NO capacitors.

$Ta_2O_5$ films, however, have an unstable chemical stoichiometric ratio, which results in Ta atoms in the film that are not fully oxidized due to differences in the composition ratio between the Ta and O atoms. Namely, it is inevitable that substitution type Ta atoms of an oxygen vacancy type exist locally in the film due to the unstable chemical composition ratio of the material itself.

Although the number and density of the oxygen vacancies in the $Ta_2O_5$ film may vary in accordance with the ratio of the components and their bonding degree, oxygen vacancies can not be avoided completely.

Therefore, in order to prevent current leakage of a capacitor, an additional oxidation process is required to oxidize the substitution type Ta atoms present in the dielectric film to produce a more stable stoichiometric ratio throughout the $Ta_2O_5$ film.

Moreover, the $Ta_2O_5$ film has a high oxidation reactivity with polysilicon and TiN, materials that are commonly used to form the upper and/or lower electrodes of the capacitor. This reaction tends to form a low dielectric oxide layer and greatly reduce the homogeneity at an interface as oxygen in the $Ta_2O_5$ film migrates to the interface and reacts with the electrode material.

Further, when the $Ta_2O_5$ film is formed, carbon atoms and carbon compounds such as $CH_4$, $C_2H_4$ and the like, and $H_2O$ are produced by the reaction between the organic portions of the organometallic $Ta(OC_2H_5)_5$ precursor and the $O_2$ or $N_2O$ gas used to form the $Ta_2O_5$ film and are incorporated into the film as impurities.

Consequently, oxygen vacancies, as well as carbon atoms, ions, and radicals exist in the $Ta_2O_5$ film as impurities and increase the leakage current of the resulting capacitors and degrade their dielectric characteristics.

A proposed solution to these problems is a post-formation thermal treatment (oxidation) using an electrical furnace or RTP and a $N_2O$ or $O_2$ ambient to overcome these problems.

However, the post-formation thermal treatment in the $N_2O$ or $O_2$ ambient may increase the depth of the depletion layer since an oxide layer having a low dielectric constant is formed at the interface with the lower electrode.

Regarding the problems resulting from the post-formation thermal treatment and the subsequent formation of a contact plug for storing electric charges and a dielectric layer, a capacitor in a semiconductor device and a conventional method of fabrication are explained below with reference to FIGS. 1–3.

FIGS. 1 and 2 show cross-sectional views of a capacitor in a semiconductor device and a fabrication method thereof according to a conventional method.

Referring to FIG. 1, an insulating interlayer 3, a barrier nitride layer 5, and a buffer oxide layer 7 are sequentially deposited on a semiconductor substrate 1. In this case, the insulating interlayer 3 is preferably formed by depositing HDP, BPSG, or SOG materials. The barrier nitride layer 5 is preferably formed using a plasma nitride deposition and the buffer oxide layer 7 is preferably deposited using PE-TEOS.

An upper surface of the buffer oxide layer 7 is then coated with a photoresist pattern (not shown in the drawing) for a plug contact mask. Using the photoresist pattern as a mask, contact holes 9 are then formed by removing portions of the buffer oxide layer 7, the barrier nitride layer 5, and the insulating interlayer 3 to expose portions of the semiconductor substrate 1.

The photoresist pattern (not shown in the drawing) is then removed and a polysilicon material is deposited on the wafer. The polysilicon fills the contact holes 9 and forms a layer on the upper surface of the buffer oxide 7. Contact plugs 11 are then formed by selectively removing the polysilicon material from the buffer oxide 7 by blanket etch.

Referring to FIG. 2, a cap oxide layer 13 is then deposited on an exposed upper surface of the entire structure including the contact plugs 11.

After the cap oxide layer 13 has been coated with a photoresist pattern (not shown in the drawing) for a storage node mask, upper surfaces of the contact plugs 11 are exposed by selectively removing the cap oxide layer 13 using the photoresist pattern as an etch mask.

A doped polysilicon layer 15 is then deposited on the exposed surface of the cap oxide layer 13 and the exposed upper surface of the contact plugs 11.

Referring to FIG. 2, lower electrodes 15a are formed by selectively removing the doped polysilicon layer 15 with blanket etch until the cap oxide layer 13 is exposed. A TaON or Ta2O5 dielectric layer 17 is then formed on an upper surface of the entire structure including the lower electrodes 15a.

A thermal treatment is then performed on the TaON or $Ta_2O_5$ dielectric layer 17 in an ambient of $N_2O$ or $O_2$.

Finally, an upper electrode 19 is formed on the TaON or $Ta_2O_5$ dielectric layer 17 to complete the capacitor fabrication.

As mentioned above, the contact plug 11 for a lower electrode contact in a capacitor in a semiconductor device using a TaON or $Ta_2O_5$ dielectric as shown in FIG. 1, is formed by sequentially depositing the insulating interlayer (an oxide layer existing between the bit lines and the lower electrodes, which is not shown in the drawing), a barrier nitride layer, and an oxide buffer layer. These layers are then selectively removed to form an opening, a layer of conductive material is deposited, and the portion of the conductive layer that is not inside the opening removed area is removed to leave contact plugs.

Unfortunately, when the contact plugs are formed in such a manner, as shown in FIG. 2, the contact plugs 11 protrude out over the barrier nitride layer 5 by about 500 to 1500 Å. This tends to reduce the area occupied by the lower electrodes and cause electrical degradation and reliability problems as a result of the increased probability of generating bridges between adjacent contact plugs.

Further, the depletion layer becomes deeper since an oxide layer having a low dielectric constant is formed at the interface between the lower electrodes and the dielectric layer during the subsequent thermal treatment in the $N_2O$ or $O_2$ ambient on the TaON or $Ta_2O_5$ dielectric layer.

Thus, the efficiency of the capacitor is reduced as a depletion ratio (C) ranges from about 7 to 17%.

In this case, the depletion ratio $(C)=1-\{(C_{max}-C_{min})/C_{max}\}\times 100$, where $C_{max}$ is a capacitance $C_s$ when "+" voltage is applied to the upper electrode and $C_{min}$ is a capacitance $C_s$ when "−" voltage is applied to the upper electrode.

In the fabrication method of TaON capacitor in the related art, thermal treatment is carried out in a $N_2O$ or $O_2$ ambient at a temperature of 700 to 800° C. after deposition of the TaON film so as to remove the oxygen vacancies and carbon impurities in the film that would result in leakage current in the capacitor.

Unfortunately, during such thermal treatment, a portion of the nitrogen, which comprise as much as 20 to 30% of the TaON film, migrate to the surface of the polysilicon layer forming the lower electrode so as to be piled up while a portion of the nitrogen components diffuse outside so as to cause dielectric loss, thereby failing to provide sufficient and large charge capacitance.

SUMMARY OF THE INVENTION

Accordingly, the present invention is directed to a capacitor for a semiconductor device and a method for fabricating such capacitors that substantially eliminates or overcomes one or more of the problems, limitations, and disadvantages of the prior art methods and devices.

The object of the present invention is to provide a capacitor for a semiconductor device and a fabrication method that reduces or eliminates reduced product cost by decreasing both the number of unit processes and total processing time necessary to form a contact plug.

Another object of the present invention is to provide a capacitor for a semiconductor device and a method of fabricating such capacitors that reduces or eliminates the generation of bridges between adjacent contact plugs to improve the yield and reliability of the resulting semiconductor device.

A further object of the present invention is to provide a capacitor for a semiconductor device and a method of fabricating such capacitors that provide a high charge capacitance by minimizing the depletion ratio toward the lower electrode.

Another further object of the present invention is to provide a capacitor for a semiconductor device and a method of fabricating such capacitors that produces a capacitor suitable for a highly-integrated memory devices by increasing the dielectric constant of a TaON dielectric layer through subsequent thermal treatment or plasma annealing treatment.

Additional features and advantages of the invention will be set forth in the description which follows, and in part will be apparent from the description, or may be learned by practice of the invention. The objectives and other advantages of the invention will be realized and attained by the structure particularly pointed out in the written description and claims as well as illustrated in the referenced drawings.

To achieve these and other advantages, and in accordance with the purpose of the present invention as embodied and broadly described, a method of fabricating a capacitor in a semiconductor device according to the present invention includes the steps of providing a semiconductor substrate and forming a lower electrode having MPS (metastable polysilicon) on the semiconductor substrate. The lower electrode is then doped at a temperature 550 to 660° C. in a phosphorus gas ambient, a TaON dielectric layer is formed on the lower electrode, and an upper electrode is formed on the TaON dielectric layer.

In another aspect, a method of fabricating a capacitor in a semiconductor device according to the present invention includes the steps of providing a semiconductor substrate, forming an insulating interlayer on the semiconductor substrate wherein a contact hole is formed through the insulating interlayer. A contact plug is then formed in the contact hole and a lower electrode having MPS is then formed and electrically connected to the contact plug. The lower electrode is then doped at a temperature of 550 to 650° C. in a phosphorus gas ambient, a TaON dielectric layer is formed on the lower electrode and annealed, and an upper electrode layer is formed on the TaON dielectric layer.

In a further aspect, a method of fabricating a capacitor in a semiconductor device according to the present invention includes the steps of providing a semiconductor substrate, forming a first insulating interlayer having a first contact hole on the semiconductor substrate. A first contact plug is then formed in the first contact hole from doped polysilicon, an etch barrier layer is then formed on an upper surface of the first insulating interlayer and the contact plug, and a second insulating interlayer is formed on the etch barrier layer. A hard mask polysilicon layer and an anti-reflection layer are then formed on the second insulating interlayer and a second contact hole is formed to expose an upper surface of the contact plug by removing the overlaying anti-reflection layer, hard mask polysilicon layer, second insulating interlayer, and the etch barrier layer. A doped polysilicon layer is then formed on the anti-reflection layer and the exposed upper surface of the contact plug, an MPS (metastable polysilicon) layer is then formed on the doped polysilicon layer and thermally doped at a temperature of 550 to 660° C. in a phosphorus gas ambient. A sacrificial layer is then formed to bury the MPS layer and an upper surface of the second insulating interlayer is then exposed by selectively removing the sacrificial layer, the MPS layer, the doped polysilicon layer, the anti-reflection layer, and the hard mask polysilicon layer, completely removing the remaining sacrificial layer, forming a TaON dielectric layer on the exposed surface of the second insulating interlayer and polysilicon layer of the MPS layer, carrying out a first annealing treatment on the TaON dielectric layer at a temperature of 700 to 900° C. in an ambient of $N_2O$ or $O_2$, forming an upper electrode on the TaON dielectric layer, and carrying out a second annealing treatment at a temperature of 800 to 950° C. after forming the upper electrode.

In another further aspect, a capacitor in a semiconductor device according to the present invention includes a semiconductor substrate, a lower electrode on the semiconductor substrate, the lower electrode having an MPS layer that has undergone thermal doping treatment at a temperature of 550 to 660° C. in a phosphorus gas ambient, a TaON dielectric layer formed on the lower electrode, and an upper electrode formed on the TaON dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
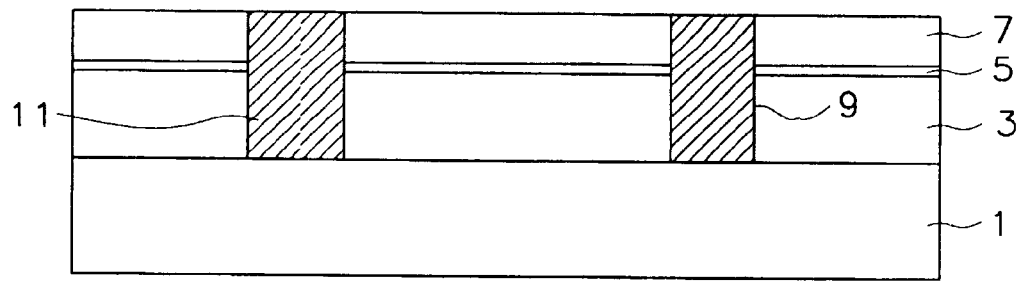
FIG. 1 and FIG. 2 show cross-sectional views of a capacitor in a semiconductor device and a method of fabricating such capacitors according to a related art.
Figure 2:
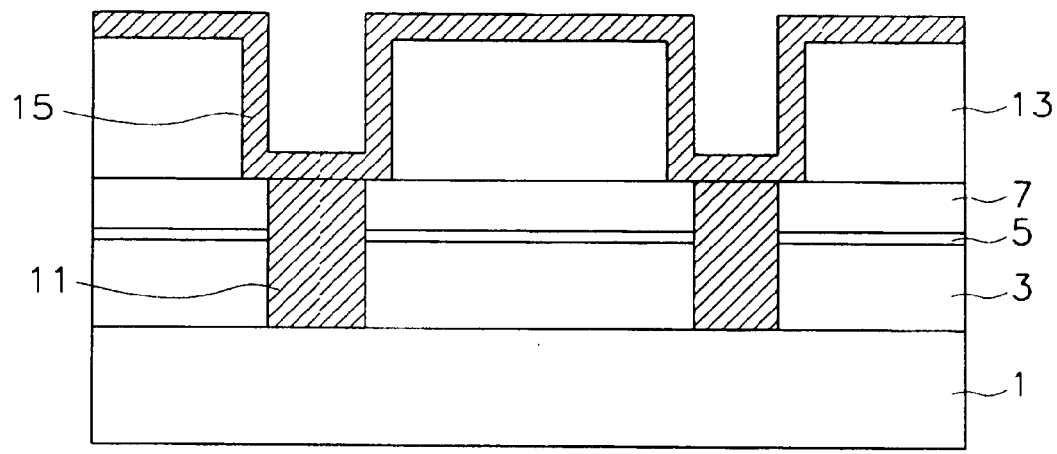

Reference will now be made in detail to the preferred embodiments of the present invention, examples of which are illustrated in the accompanying drawings. Where possible, the same reference numerals will be used to identify similar or corresponding elements throughout the specification.

Figure 3:
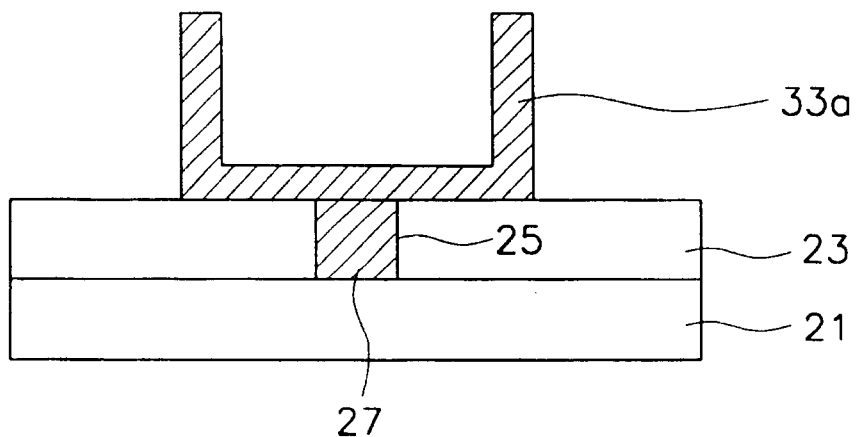
FIGS. 3–7 show cross-sectional views of a capacitor in a semiconductor device and a method of fabricating such capacitors according to the present invention.
Figure 4:
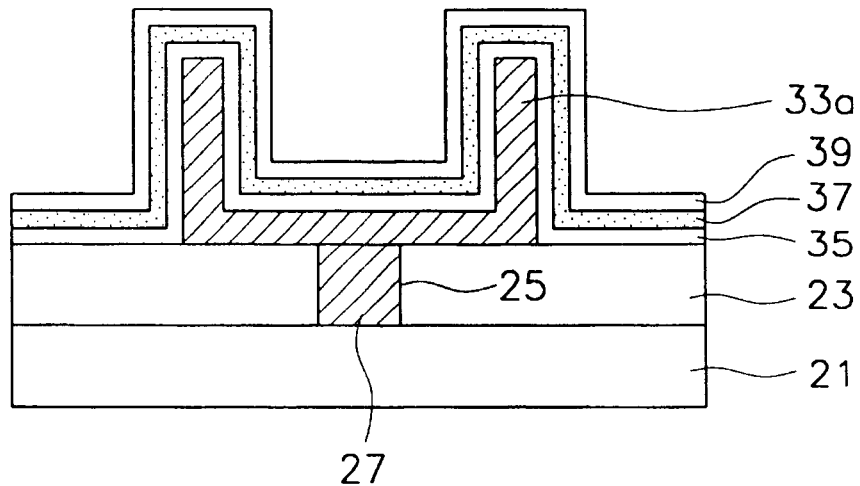

Referring to FIGS. 3 and 4, according to an embodiment of the present invention, an insulating interlayer 23 is deposited on a semiconductor substrate 21. A photoresist pattern (not shown in the drawing) for defining a contact plug is then coated on an upper surface of the insulating interlayer 23. In this case, the insulating interlayer 23 is preferably formed by depositing a HDP, BPSG, or SOG material.

Using the photoresist pattern (not shown in the drawing) as a mask, a contact hole 25 is then formed by removing an area of the insulating interlayer 23 to expose a portion of the semiconductor substrate 21.

The photoresist pattern (not shown in the drawing) is then removed and a doped polysilicon material that fills the contact hole 25 is deposited on the exposed upper surface of the insulating interlayer 23 and into the contact hole 25. A contact plug 27 is then formed by selectively removing the upper portion of the polysilicon material using a blanket etch or CMP (chemical mechanical polishing). In this case, the doped polysilicon layer for forming the contact plug is preferably formed using LPCVD or RTP equipment and has a phosphorus concentration over $2 \times 10^{20}$ atoms/cm³.

A barrier nitride layer 29 (shown in FIG. 5), which will be used as an etch barrier when etching the cap oxide layer during a subsequent step, is deposited on an exposed upper surface of the insulating interlayer 23 and contact plug 27. In this case, the barrier nitride layer 29 is preferably deposited to a thickness of 200 to 800 Å using LPCVD, PECVD or RTP equipment.

Figure 5:
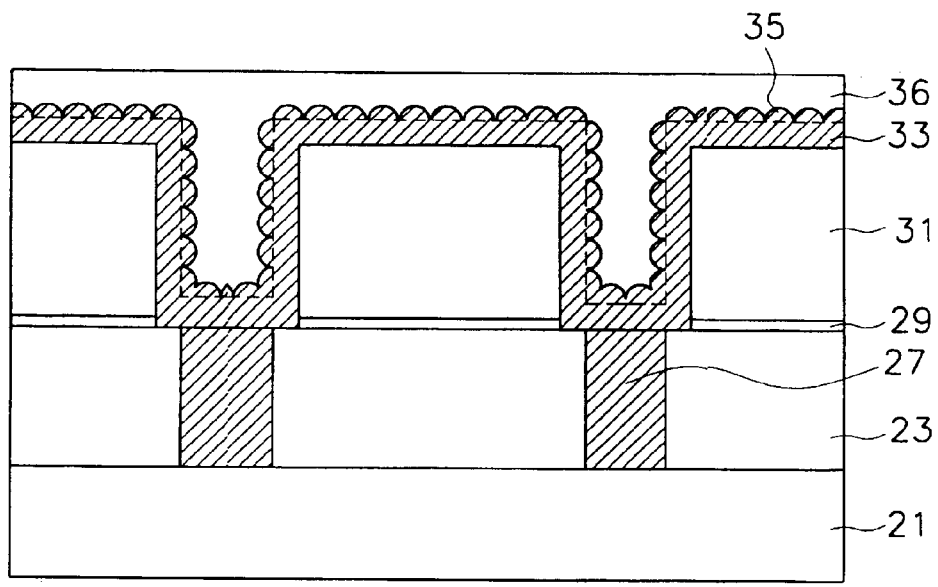

Referring to FIG. 5, a cap oxide layer 31 is formed on the barrier nitride layer 29, and then a hard mask polysilicon layer (not shown in the drawing) and an anti-reflection layer (not shown in the drawing) are sequentially formed on the cap oxide layer. In this case, the cap oxide layer 31 is preferably formed from one of PE-TEOS, PSG, and USG using a Si—H base source.

After a photoresist pattern (not shown in the drawing) for a charge electrode mask has been formed on the anti-reflection layer (not shown in the drawing), the anti-reflection layer and the hard mask polysilicon layer are etched using the photoresist pattern (not shown in the drawing) as an etch mask.

The barrier nitride layer 29, which provided etch protection, and the cap oxide layer 31 are then etched to expose portions of the contact plug 27 and insulating interlayer 23. In this case, the etch conditions for the cap oxide layer 31 barrier nitride layer are selected to provide an etch selectivity between the oxide and nitride layers a ratio of between 5:1 and 20:1.

Moreover, the anti-reflection layer (not shown in the drawing) is formed 300 to 1000 Å thick by deposition or coating using inorganic material such as SiON or an organic material sufficient to improve the subsequent masking step.

After the photoresist pattern has been removed therefrom, a doped polysilicon layer 33 for forming a lower electrode is deposited on the anti-reflection layer (not shown in the drawing) and the exposed upper surface of the contact plug 25.

Subsequently, a MPS (metastable polysilicon) or HSG (Hemi Spherical Grain) layer 35 is formed on a surface of the doped polysilicon 33 at a temperature of about 550 to 650° C. by depositing an undoped polysilicon thereon.

After the MPS or HSG layer 35 has been formed, thermal doping is carried out in a phosphorus gas ambient, for instance, 1 to 5% $PH_3/N_2$ or 50 sccm to 2000 sccm $PH_3$/He.

In this case, the thermal doping is carried out at a low temperature between about 550° C. and 650° C., preferably between 575° C. and 625° C., and more preferably between 595° C. and 605° C., for 30 to 120 minutes at a pressure between 1 to 100 Torr in an electric furnace.

Figure 8:
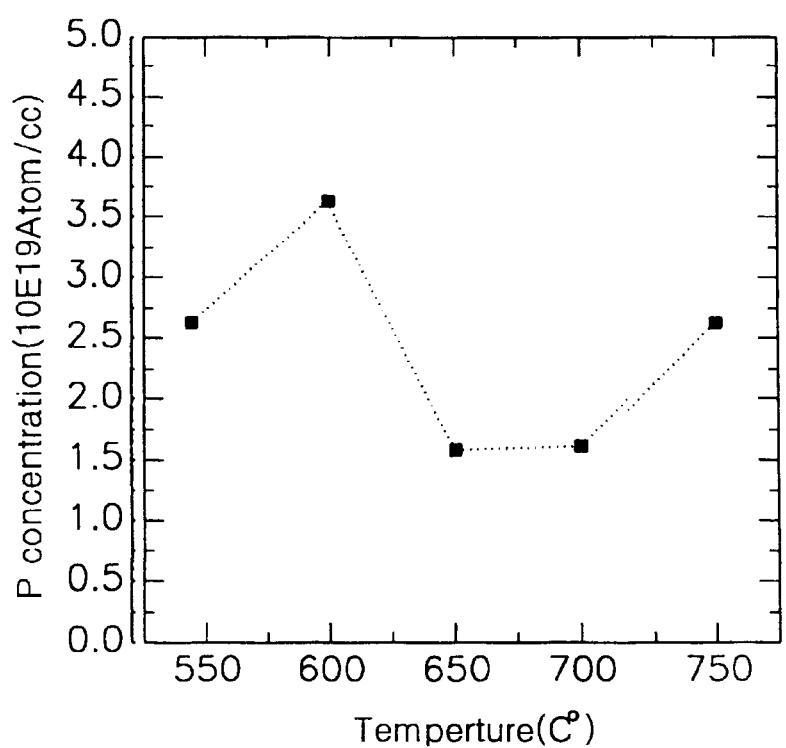
FIG. 8 shows a graph of the phosphorus concentration variation depending on temperature after thermal-doping a lower electrode according to the present invention.

As reflected in FIG. 8, when carrying out the thermal doping at temperatures between 550 to 750° C., the highest phosphorus doping concentration was achieved near 600° C.

While not wishing to be bound by any particular mechanism, it is believed that the results of the thermal doping process may be explained as follows.

$PH_3$ gas decomposes at 570 to 580° C. and the morphology of the lower electrode silicon becomes more crystalline during phosphorus doping processes at temperatures over 700° C. The silicon, however, retains its generally amorphous morphology (a-Si) a temperatures under 650° C.

Moreover, a sticking coefficient at a surface of the silicon of the lower electrode tends to be higher at temperatures lower than 650° C., which is because dangling bonds exist predominately near the surface region while amorphous silicon comprises the majority of the bulk silicon forming the lower electrode. Thus, it is understood that the highest doping value is attained near 600° C.

A sacrificial layer 36 that fills up the inner part of layer 35 is then formed on the exposed surface of the entire structure.

In this case, the sacrificial layer 36 may be formed by coating a photoresist layer 0.5 to 1.5 μm thick, by depositing an oxide layer such as PSG or USG 0.1 to 0.5 μm thick, by depositing a SOG layer.

On the other hand, when the cap oxide layer 31 is formed of PE-TEOS, the material filling the inner part of the MPS or HSG layer 35 is preferably formed by depositing a PSG or USG layer, which exhibit a wet etch rate that is three times faster than that of the alternative photoresist layer.

Figure 6:
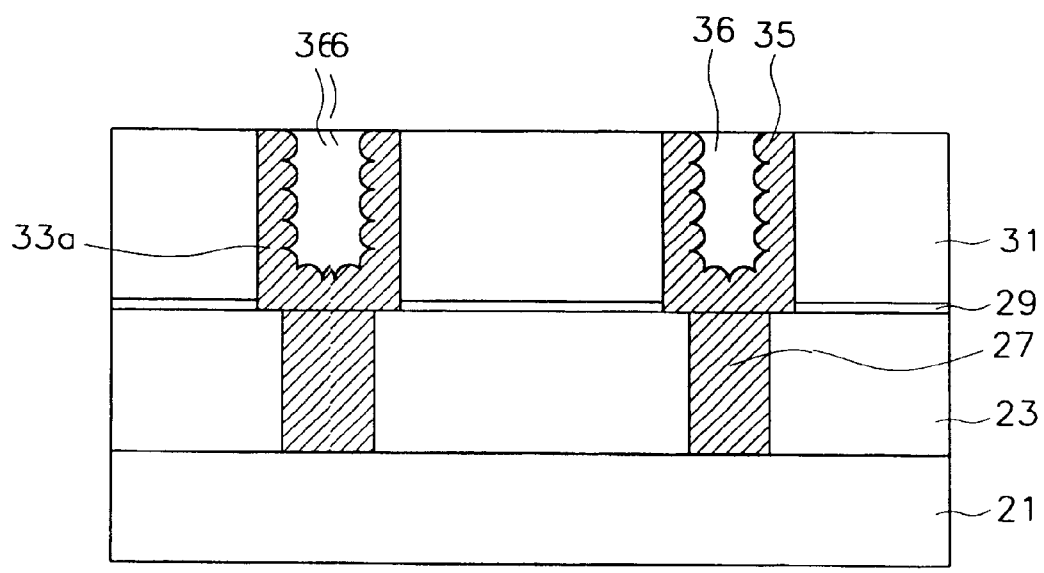

Referring to FIG. 6, an upper surface of the cap oxide layer 31 is exposed by selectively removing the sacrificial layer 36, MPS or HSG layer 35, doped polysilicon layer 33, anti-reflection layer (not shown in the drawing), and hard mask polysilicon layer (not shown in the drawing) by a CMP process.

An alternative to the CMP process for removing the sacrificial layer 36, MPS layer 35, doped polysilicon layer 33, anti-reflection layer, and hard mask polysilicon layer, is using a blanket etch-back process. The etch-back process should preferably include sufficient overetch to remove 5 to 10% of the polysilicon of the lower electrode, including the hard mask polysilicon.

Next, a concave electric charge storage electrode consisting of the MPS or HSG layer 35 and doped polysilicon layer 33 is formed by completely removing the sacrificial layer 36 remaining on the exposed surface of the MPS or HSG layer 35. When an oxide is used to form the sacrificial layer 36, it is preferably removed using a wet etch process.

In another embodiment of the lower electrode, instead of a basic concave lower electrode, various three-dimensional structures such as double or triple stacked structures based on simple stack or cylindrical structures may be utilized to form the lower electrode.

Moreover, as a further embodiment of the lower electrode instead of the concave structure, the lower electrode is formed by forming a cylindrical storage node and then forming the MPS or HSG layer on a surface of the storage node.

Figure 7:
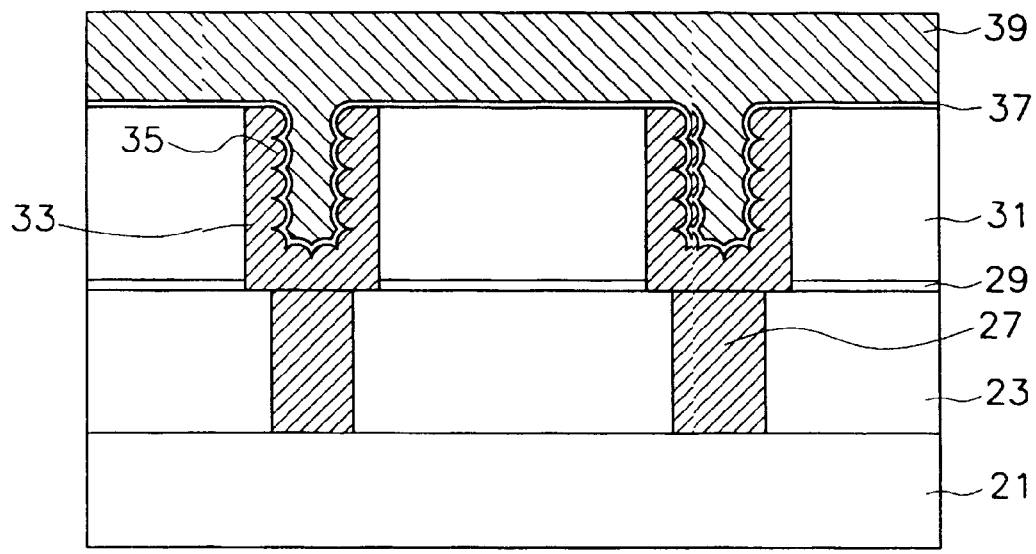

Referring to FIG. 7, a TaON dielectric layer 37 is deposited on an exposed surface of the cap oxide layer 31 and the MPS or HSG layer 35.

In order to remove carbon impurities and oxygen vacancies, the TaON dielectric layer 37 is then annealed at a temperature between 700 and 900° C. in an ambient of $N_2O$ or $O_2$.

In order to increase the dielectric constant of the TaON dielectric layer 37, another anneal may be carried out on the TaON dielectric layer 37 in an $NH_3$ ambient at a temperature of 700 to 900° C. in an electric furnace or RTP, or in a plasma reactor under an $NH_3$ ambient at a lower temperature of 400 to 500° C. Thus, nitrogen is injected into the TaON dielectric layer 37 or nitridation is achieved.

When the anneal is carried out in an $NH_3$ ambient, a surface of the TaON dielectric layer becomes irregular. In this case, leakage current generation from the capacitor is reduced by carrying out a plasma oxidation of the irregular surface of the TaON dielectric layer for 1 minute to 2 minutes at a low temperature of 400 to 500° C. at an $N_2O$ or $O_2$ ambient.

A TiN layer 39 is then deposited 200 to 500 Å thick on the TaON dielectric layer 37, preferably using CVD with $TiCl_4$ gas. An upper electrode is then formed by selectively patterning and etching the TiN layer 39.

In another embodiment of the upper electrode, a doped polysilicon layer (not shown in the drawing) deposited 500 to 1500 Å thick is stacked on the TiN layer 39 as a buffer layer against stress and thermal impact generated during subsequent thermal processes and forms part of the upper electrode.

In a further embodiment of the upper electrode, doped polysilicon or a metal material such as TaN, W, WN, WSi, Ru, $RuO_2$, Ir, $IrO_2$, or Pt may be used to form layer 39 for the upper electrode instead of TiN.

During the steps of depositing the TaON dielectric layer and carrying out thermal treatment at a temperature under 800° C. after the thermal doping in FIG. 5, some deactivation occurs, in which some of the phosphorus dopant in the polysilicon forming the lower electrode migrates toward a surface or forms local agglomerations.

In order to maximize the thermal doping effect by activating the phosphorus dopant in the lower electrode and preventing such a deactivation, annealing using RTP or an electric furnace at a temperature of 800 to 950° C. may be performed after forming the upper electrode. In this case, the annealing treatment by RTP is carried out for 10 to 60 seconds or the other annealing treatment using an electric furnace is carried out for 5 to 30 minutes in a $N_2$ ambient. The depletion layer toward the lower electrode maybe greatly reduced by these additional annealing processes.

Accordingly, a capacitor in semiconductor device fabricated according to the present method provides a number of advantages.

The present invention reduces product cost by reducing the number of unit processes compared to the conventional methods. The present method forms a contact for the lower electrode, in which the contact plug is formed by forming a contact hole directly after the formation of the insulating interlayer, depositing polysilicon for forming the contact plug, and carrying out a blanket etch back on the polysilicon. Yet in the conventional method, the lower electrode contact is formed by sequentially depositing an insulating interlayer (e.g., an oxide layer lying between the bitline and lower electrode) and an oxide buffer layer on the barrier nitride layer before carrying out the contact etch.

When compared with semiconductor capacitors formed using the conventional method, a capacitor according to the present invention provides a reduced depletion ratio C of up to about 2% as the capacitance $C_{min}$, i.e., $C_s$ when applying "−" voltage to the upper electrode, is increased by minimizing the depletion ratio toward the lower electrode, in which the phosphorus impurity concentration in the lower electrode is increased by carrying out phosphorus thermal doping on the lower electrode (polysilicon layer having the irregularly-shaped MPS layer) at a lower temperature of 550 to 650° C.

Therefore, the present invention provides increased charge capacitance of up to 10% compared to a capacitor having the same lower electrode area using the TaON or $Ta_2O_5$ dielectric layer formed by the conventional methods.

Moreover, the present invention provides an increased dielectric constant for the TaON dielectric layer by carrying out an additional thermal annealing treatment or plasma annealing treatment on the TaON dielectric layer, in which the annealing treatment is carried out in a NH₃ ambient at a normal or reduced pressure using RTP or an electric furnace.

Further, a TaON capacitor having a concave structure according to the present invention, which provides larger charge capacitance than that of the capacitor occupying the same lower electrode area using a NO, TaON or Ta₂O₅ dielectric layer formed by conventional methods, can be used to produce a memory cell for a semiconductor memory device having a critical dimensions of less than 0.16 μm and improving the refresh time for the resulting memory cell.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a capacitor in a semiconductor device comprising:
    preparing a semiconductor substrate;
    forming a lower electrode, the lower electrode comprising a surface layer of metastable polysilicon;
    doping the lower electrode in a phosphorus gas atmosphere and at a temperature of 550 to 660° C., wherein the phosphorus gas atmosphere is established by injecting a mixture of PH3 and N2 or a mixture of PH3 and He into an electric furnace;
    forming a TaON dielectric layer on the lower electrode; and
    forming an upper electrode on the TaON dielectric layer.

2. The method of claim 1, wherein the lower electrode comprises a doped polysilicon layer upon which the surface layer of meta-stable polysilicon is subsequently formed.

3. The method of claim 1, wherein the step of doping the lower electrode further comprises establishing the phosphorus gas atmosphere at a pressure of 1 to 100 Torr for a period of 30 to 120 minutes in an electric furnace.

4. The method of claim 1, further comprising a first annealing step including annealing the TaON dielectric layer at a temperature of 700 to 900° C. in a N₂O or O₂ atmosphere, the first annealing step being completed before the step of forming the upper electrode.

5. The method of claim 4, further comprising a second annealing step wherein including annealing the TaON dielectric layer at a temperature of 700 to 900° C. in an NH₃ atmosphere in RTP equipment or in an electric furnace or is annealed at a temperature of 400 to 500° C. in an NH₃ atmosphere in plasma annealing equipment, the second annealing step being performed after the first annealing step is completed and before the step of forming the upper electrode.

6. The method of claim 5, further comprising a plasma oxidation step wherein the TaON dielectric layer is oxidized in a plasma at a temperature of 400 to 500° C. for 1 minute to 2 minutes in an atmosphere comprising N₂O or O₂, the plasma oxidation step being performed after the second annealing step has been completed and before the step of forming the upper electrode.

7. The method of claim 1, further comprising a final annealing step including annealing the upper electrode at a temperature of 800 to 950° C.

8. The method of claim 1, wherein the step of forming the electrode further comprises forming a doped silicon layer on a metallic layer.

9. The method of claim 8, wherein the metallic layer is one selected from the group consisting of TiN, TaN, W, WN, WSi, Ru, RuO₂, Ir, IRO₂, and Pt.

10. A method of fabricating a capacitor in a semiconductor device comprising the steps of:
    preparing a semiconductor substrate;
    forming an insulating interlayer on the semiconductor substrate;
    forming a contact hole through the insulating interlayer;
    forming a contact plug in the contact hole;
    forming a lower electrode, the lower electrode being in electrical contact with the contact plug;
    forming a meta-stable polysilicon layer on a surface of the lower electrode;
    doping the lower electrode with phosphorus at a temperature of 550 to 650° C. in an ambient of phosphorus gas;
    forming a TaON dielectric layer on the lower electrode;
    annealing the TaON dielectric layer; and
    forming an upper electrode layer on the TaON dielectric layer.

11. The method of claim 10, wherein the step of forming lower electrode further comprises
    depositing a doped polysilicon layer;
    patterning the doped polysilicon layer; and
    etching the doped polysilicon layer.

12. The method of claim 10, wherein the step of doping the lower electrode further comprises
    maintaining a pressure between 1 and 100 Torr for a treatment period of 30 to 120 minutes.

13. The method of claim 10, wherein the phosphorus gas comprises a gas mixture of PH₃/N₂ or PH₃/He, the gas mixture being introduced at a rate between 50 and 2000 sccm.

14. The method of claim 10, wherein the step of annealing the TaON dielectric layer further comprises maintaining a temperature of 700 to 900° C. under an ambient of N₂O or O₂.

15. The method of claim 10, wherein the step of annealing the TaON dielectric layer, further comprises the steps of:
    a first annealing treatment at a temperature of 700 to 900° C. under an ambient of N₂O or O₂; and
    a second annealing treatment comprising
       a thermal treatment by RTP or in an electric furnace at a temperature of 700 to 900° C. under an NH₃ ambient or
       a plasma annealing treatment at a temperature of 400 to 500° C. under an NH₃ ambient.

16. The method of claim 15, further comprising a plasma oxidation step comprising exposing the TaON dielectric layer with plasma at a temperature of 400 to 500° C. for 1 minute to 2 minutes under an ambient of N₂O or O₂, the plasma oxidation step being performed after the second annealing treatment and before the step of forming the upper electrode.

17. The method of claim 10, further comprising annealing the upper electrode at a temperature of 800 to 950° C. using RTP or an electric furnace.

18. The method of claim 10, wherein the step of forming the upper electrode layer further comprises depositing a layer of at least one metal based material selected from a group consisting of TiN, TaN, W, WN, WSi, Ru, RuO₂, Ir, IRO₂, and Pt.

19. The method of claim 18, further comprising depositing a doped polysilicon on the layer of the metal based material.

20. A method of fabricating a capacitor in a semiconductor device comprising the steps of:

preparing a semiconductor substrate;

forming a first insulating interlayer;

forming a first contact hole through the insulating interlayer to expose a portion of the semiconductor substrate;

forming a first contact plug in the first contact hole;

forming an etch barrier layer on an upper surface of the first insulating interlayer and on an upper surface of the contact plug;

forming a second insulating interlayer on the etch barrier layer;

forming a hard mask polysilicon layer on the etch barrier layer;

forming an anti-reflection layer on the hard mask polysilicon layer;

forming a second contact hole having sidewalls through the anti-reflection layer, the hard mask polysilicon layer, the second insulating interlayer and the etch barrier layer to expose the upper surface of the contact plug;

forming a doped polysilicon layer on the anti-reflection layer, the sidewalls of the second contact opening, and the exposed upper surface of the contact plug;

forming a MPS (meta-stable polysilicon) layer on the doped polysilicon layer;

doping the MPS layer at a temperature of 550 to 660° C. under an ambient of phosphorus gas to form a doped MPS layer;

forming a sacrificial layer covering the doped MPS layer;

exposing an upper surface of the second insulating interlayer by selectively removing portions of the sacrificial layer, the MPS layer, the doped polysilicon layer, the anti-reflection layer, and the hard mask polysilicon layer;

removing completely remaining portions of the sacrificial layer to expose a surface of the remaining portion of the MPS layer;

forming a TaON dielectric layer on the exposed surface of the second insulating interlayer and the surface of the MPS layer;

annealing the TaON dielectric layer at a temperature of 700 to 900° under an ambient of $N_2O$ or $O_2$;

forming an upper electrode on the TaON dielectric layer; and annealing the upper electrode at a temperature of 800 to 950° C.

21. The method of claim 20, wherein the step of forming the first insulating interlayer comprises depositing a layer of at least one insulating material selected from a group consisting of HDP, BPSG, and SOG and wherein
the step of forming the second insulating interlayer comprises depositing a layer of at least one insulating material selected from a group consisting of HDP, BPSG, and SOG.

22. The method of claim 20, wherein the step of forming the contact plug further comprises the steps of:

depositing a doped polysilicon layer on the first insulating interlayer and into the contact hole; and removing an upper portion of the doped polysilicon layer selectively by CMP or blanket etch to expose a surface of the first insulating interlayer.

23. The method of claim 20, wherein step of depositing the doped polysilicon layer comprises an LPCVD process or a RTP process.

24. The method of claim 20, wherein the step of forming the etch barrier layer comprised depositing a nitride layer to a thickness of 200 to 800 Å using a process selected from a group consisting of an LPCVD process, a PECVD process, and a RTP process.

25. The method of claim 20, wherein the step of forming the anti-reflection layer further comprises forming a layer of an inorganic material 300 to 1000 Å thick or a layer of an organic material 300 to 1000 Å thick.

26. The method of claim 20, wherein the step of doping the MPS layer further comprises maintaining a pressure between 1 and 100 Torr for 30 to 120 minutes in an electric furnace while injecting between 50 and 2000 sccm of a gas mixture comprising $PH_3/N_2$ or $PH_3/He$.

27. The method of claim 20, wherein the step of forming the sacrificial layer comprises depositing a photoresist layer 0.5 to 1.5 $\mu$m thick or an oxide layer 0.1 to 0.5 $\mu$m thick.

28. The method of claim 20, wherein the step of forming the sacrificial layer comprises depositing a PSG layer or a USG layer and further wherein
the step of depositing the second insulating interlayer comprises depositing PE-TEOS layer.

29. The method of claim 20, wherein the step of annealing the TaON dielectric layer, after annealing the TaON under the ambient of $N_2O$ or $O_2$ is complete, further comprises a second annealing of the TaON dielectric layer by RTP or in an electric furnace at a temperature of 700 to 900° C. under an $NH_3$ ambient or a second annealing of the TaON dielectric layer in a plasma at a temperature of 400 to 500° C. under an $NH_3$ ambient.

30. The method of claim 20, wherein the step of forming the upper electrode layer further comprises the step of depositing at least one metal based material selected from the group consisting of TiN, TaN, W, WN, WSi, Ru, $RuO_2$, Ir, $IrO_2$, and Pt.

31. The method of claim 30, further comprising a step of plasma oxidation treatment at a temperature of 400 to 500° C. for 1 minute to 2 minutes at an ambient of $N_2O$ or $O_2$, the step plasma oxidation treatment being performed after the second annealing step under the $NH_3$ ambient has been completed.

32. The method of claim 30, wherein the step of forming the upper electrode further comprises depositing a doped polysilicon on the layer of metal based material to form a stacked upper electrode.

* * * * *